US010972091B1

(12) United States Patent
Malladi

(10) Patent No.: US 10,972,091 B1
(45) Date of Patent: Apr. 6, 2021

(54) RADIO FREQUENCY SWITCHES WITH VOLTAGE EQUALIZATION

(71) Applicant: NXP USA, Inc., Austin, TX (US)

(72) Inventor: Venkata Naga Koushik Malladi, Chandler, AZ (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 16/701,927

(22) Filed: Dec. 3, 2019

(51) Int. Cl.
*H03K 17/16* (2006.01)
*H04B 1/48* (2006.01)
*H01L 27/12* (2006.01)
*H01L 21/84* (2006.01)

(52) U.S. Cl.
CPC .......... *H03K 17/162* (2013.01); *H01L 21/84* (2013.01); *H01L 27/1203* (2013.01); *H04B 1/48* (2013.01)

(58) Field of Classification Search
CPC ... H03K 17/162; H01L 21/84; H01L 27/1203; H04B 1/48
See application file for complete search history.

(56) References Cited

U.S. PATENT DOCUMENTS

| 5,808,322 | A | 9/1998 | Nicholson et al. |
| 7,161,197 | B2 | 1/2007 | Nakatsuka et al. |
| 7,504,677 | B2 | 3/2009 | Glass et al. |
| 7,532,094 | B2 | 5/2009 | Arnold |
| 8,008,988 | B1 | 8/2011 | Yang et al. |
| 8,174,050 | B2 | 5/2012 | Boles et al. |
| 8,451,044 | B2 * | 5/2013 | Nisbet ................. H03K 17/687 327/389 |
| 8,536,636 | B2 | 9/2013 | Englekirk |
| 8,723,260 | B1 | 5/2014 | Carroll et al. |
| 8,824,974 | B2 | 9/2014 | Nakajima et al. |
| 9,438,223 | B2 * | 9/2016 | de Jongh ............. H03K 17/162 |
| 9,484,973 | B1 | 11/2016 | Carroll et al. |
| 9,595,951 | B2 | 3/2017 | Sprinkle et al. |
| 9,780,090 | B2 | 10/2017 | Fraser et al. |
| 10,326,018 | B1 * | 6/2019 | Malladi ............... H01L 27/0248 |

(Continued)

FOREIGN PATENT DOCUMENTS

DE 10 2008 004 861 A1 7/2009
WO 2016/205553 A1 12/2016

OTHER PUBLICATIONS

Malladi, V., U.S. Appl. No. 16/566,710 entitled, "High Speed Switching Radio Frequency Switches," filed Sep. 10, 2019.

(Continued)

*Primary Examiner* — Md K Talukder
(74) *Attorney, Agent, or Firm* — Sherry W. Schumm

(57) ABSTRACT

Embodiments described herein include radio frequency (RF) switches that may provide increased power handling capability. In general, the embodiments described herein can provide this increased power handling by equalizing the voltages across transistors when the RF switch is open. Specifically, the embodiments described herein can be implemented to equalize the source-drain voltages across each field effect transistor (FET) in a FET stack that occurs when the RF switch is open and not conducting current. This equalization can be provided by using one or more compensation circuits to couple one or more gates and transistor bodies in the FET stack in a way that at least partially compensates for the effects of parasitic leakage currents in the FET stack.

21 Claims, 11 Drawing Sheets

(56) References Cited

U.S. PATENT DOCUMENTS

| | | | |
|---|---|---|---|
| 10,326,440 | B1 | 6/2019 | Malladi |
| 10,784,862 | B1* | 9/2020 | Malladi ................ H03K 17/005 |
| 2005/0263799 | A1 | 12/2005 | Nakatsuka et al. |
| 2006/0217078 | A1 | 9/2006 | Glass et al. |
| 2006/0261912 | A1 | 11/2006 | Miyagi et al. |
| 2006/0270367 | A1* | 11/2006 | Burgener ................ H04B 1/48 |
| | | | 455/127.1 |
| 2007/0012730 | A1 | 1/2007 | Pailthorp |
| 2011/0001543 | A1 | 1/2011 | Kondo et al. |
| 2012/0001230 | A1 | 1/2012 | Takatani |
| 2012/0112832 | A1 | 5/2012 | Kawano et al. |
| 2014/0183609 | A1 | 7/2014 | Takatani et al. |
| 2015/0022256 | A1* | 1/2015 | Sprinkle ............ H01L 21/8234 |
| | | | 327/379 |
| 2015/0318852 | A1* | 11/2015 | Hoogzaad ............ H03K 17/063 |
| | | | 327/434 |
| 2015/0341026 | A1* | 11/2015 | de Jongh ............ H03K 17/161 |
| | | | 327/382 |
| 2016/0329874 | A1 | 11/2016 | Mohammadpour et al. |
| 2016/0373106 | A1* | 12/2016 | Shah ................... H01L 27/0629 |
| 2017/0317082 | A1 | 11/2017 | Den Hartog et al. |
| 2018/0012962 | A1 | 1/2018 | Yeh et al. |
| 2018/0197881 | A1* | 7/2018 | Scott ................... H01L 27/0629 |
| 2019/0267489 | A1 | 8/2019 | Malladi |
| 2019/0267987 | A1 | 8/2019 | Malladi |

OTHER PUBLICATIONS

Non-Final Office Action dated Oct. 24, 2018 for U.S. Appl. No. 15/907,740 6 pages.

Notice of Allowance; U.S. Appl. No. 15/907,740; 10 pages (dated Apr. 18, 2019).

Non-Final Office Action dated Oct. 24, 2018 for U.S. Appl. No. 15/908,009 7 pages.

Notice of Allowance; U.S. Appl. No. 15/908,009; 10 pages (dated Apr. 17, 2019).

Notice of Allowance; U.S. Appl. No. 16/398,811; 9 pages (dated Dec. 16, 2019).

Hsu, H. et al. "Improved GaAs PHEMT T/R Switches Performance with Multi-Gate/Islands Configuration", ResearchGate, 4 pgs. (Jan. 1, 2014).

Koya, S. et al. "Intergate-Channel-Connected Multi-Gate PHEMT Devices for Antenna Switch Applications", IEEE MTT-S International Microwave Symposium Digest, pp. 1287-1290 (Jun. 2008).

Keysight U9397A/C, technical document, http://literature.cdn.keysight.com/litweb/pdf/5989-6088EN.pdf., retrieved on Sep. 10, 2019.

Val Peterson, 7—Instrumentation, Gallium Arsenide IC Applications Handbook, pp. 225-254, ISBN 9780122577352, Copyright 1995 by Academic Press, Inc.

A. Armstrong; H. Wagner, "A 5-V/sub p-p/ 100-ps GaAs pulse amplifier IC with improved pulse fidelity," in IEEE Journal of Solid-State Circuits, vol. 27, No. 10, pp. 1476-1481, Oct. 1992.

Notice of Allowance; U.S. Appl. No. 16/398,992; 9 pages (dated Jan. 17, 2020).

Non Final Office Action; U.S. Appl. No. 16/566,710; 10 pages (dated Mar. 24, 2020).

Notice of Allowance; U.S. Appl. No. 16/566,710; 8 pages (dated Aug. 11, 2020).

\* cited by examiner

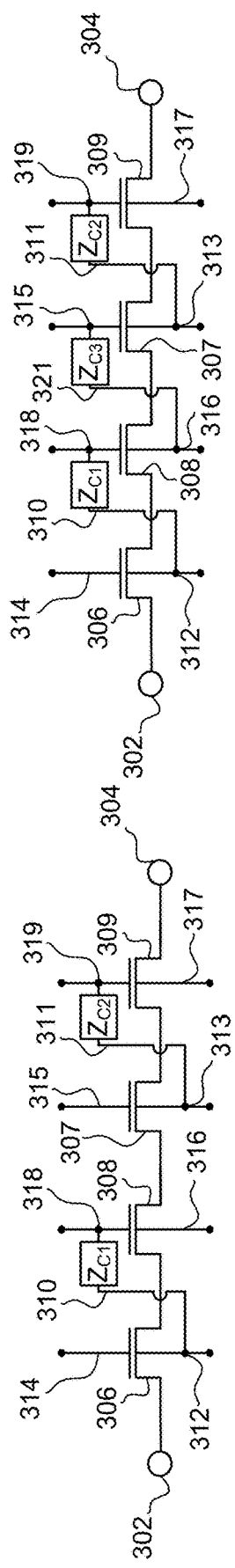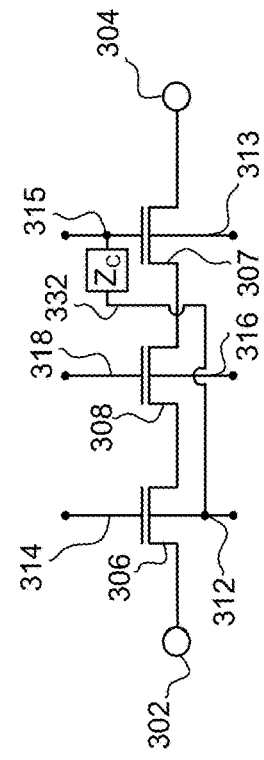
FIG. 3A
FIG. 3B
FIG. 3C

US 10,972,091 B1

RADIO FREQUENCY SWITCHES WITH VOLTAGE EQUALIZATION

TECHNICAL FIELD

Embodiments of the subject matter described herein relate generally to radio frequency (RF) switches and specifically RF switches that use field effect transistor (FET) stacks.

BACKGROUND

Radio frequency (RF) switches are used extensively in various RF applications, including RF power amplification, RF signal transmission, and RF signal reception. In various applications these RF switches need to provide both high speed switching and high power handling. To facilitate high power handling many RF switches use one or more stacks of field effect transistors (FETs), where each stack includes a series-coupled arrangement of several FETs. In such devices each FET can be a monolithic transistor device that includes a variable-conductivity channel between drain and source terminals, along with one or more gates positioned over the channel. Electrical signals provided to the gates control the conductivity of the channel during operation of the FETs. RF switches implemented with such stacks of FETs can thus provide relatively higher power handling capability.

However, one issue with such RF switches is the ability to provide high power handling capability while maintaining fast switching speed. To provide high power handling it is desirable to implement and operate the RF switches such that a nearly equal voltage is maintained across each FET in series-coupled stack of FETs when the switch is open. Specifically, maintaining a nearly equal voltage across each FET in the stack when the switch is open helps ensure that no one FET in the stack has an excessive source-drain voltage that could lead to breakdown or other failure of that FET. In contrast, if significant non-equal voltages are seen across some FETs then those FETs with higher source-drain voltages can exceed their breakdown voltage and potentially fail while other FETs with lower source-drain voltages are well below their breakdown voltage. Thus, there remains a continuing need for improved RF switches that can maintain a nearly equal voltage across FETs to improve the power handling of the switch while maintaining high speed switching.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

FIGS. 3A, 3B, and 3C are circuit diagrams of FET stacks in accordance with exemplary embodiments;

DETAILED DESCRIPTION

The embodiments described herein include radio frequency (RF) switches that may provide increased power handling capability while also providing high switching speeds. In general, the embodiments described herein can provide this increased power handling by equalizing the voltages across transistors when the RF switch is open (i.e., in an inactive or non-current-conducting state). Specifically, the embodiments described herein can be implemented to equalize the source-drain voltages across each field effect transistor (FET) in a FET stack that occur when the RF switch is open and not conducting current. This equalization can be provided by using one or more compensation circuits to couple one or more gates and transistor bodies in the FET stack in a way that at least partially compensates for the effects of parasitic leakage currents in the FET stack. This compensation of the effects of parasitic leakage currents equalizes the source-drain voltages across each FET that occurs when the RF switch is open, and can thus improve the power handling ability of the RF switch. Furthermore, this compensation can be done in a way that maintains high speed switching capability in the RF switch.

In one embodiment, the RF switch includes a first field-effect transistor stack coupled between a first node and a second node, where the first FET stack includes a first series-coupled plurality of field-effect transistors (FETs). Each FET includes source and drain regions separated by variably-conductive channel regions, gates overlying the channel regions and coupled to a gate terminal (or simply "gate"), a source terminal coupled too the source regions, a drain terminal coupled to the drain regions, and a transistor body. The transistor body of a FET is that portion of the semiconductor substrate beneath the gate region and in between the source and drain regions of the FET. As such, transistor body includes the portion of the semiconductor substrate in which a conducting channel is formed during operation of the FET when appropriate potentials are applied to the gate, drain and source terminals of the FET. In an embodiment the first series-coupled plurality of FETs includes at least a first FET, a second FET, and at least a first compensation circuit. The first compensation circuit is implemented to electrically couple a body of the first FET to a gate of the second FET. This electrical coupling of the body of one FET to the gate of another FET through the first compensation circuit provides an equalization of voltages across the first series-coupled plurality of FETs. Specifically, in one embodiment the first compensation circuit includes one or more impedances adapted to compensate for the effects of the parasitic leakage currents in a way that can equalize the source-drain voltages across each FET that occurs when the RF switch is open.

Figure 1:
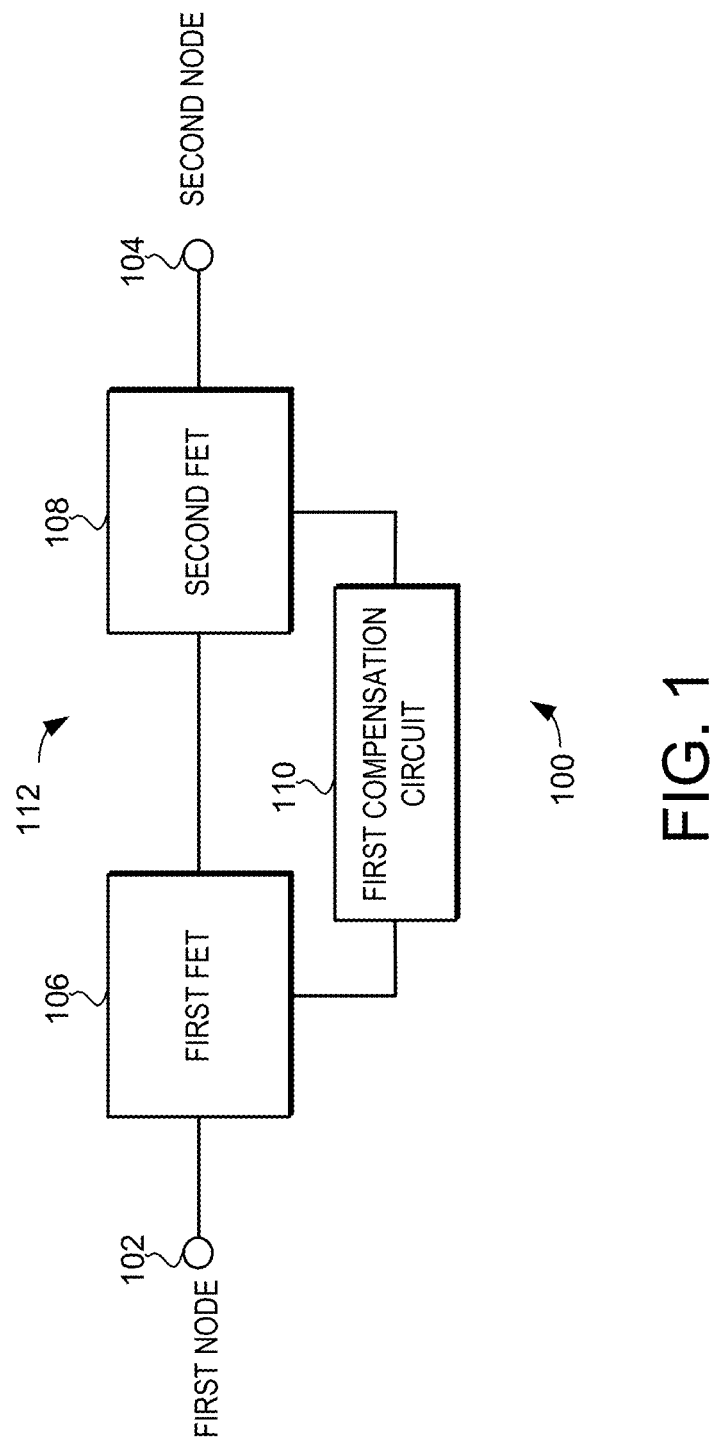
FIG. 1 is a schematic diagram of a field effect transistor (FET) stack in accordance with an exemplary embodiment.

Turning now to FIG. 1, a schematic view of an RF switch 100 in accordance with an embodiment is illustrated. The RF switch 100 includes a first node 102, a second node 104, a first field-effect transistor (FET) 106, a second FET 108, and a first compensation circuit 110. The first FET 106 and the second FET 108 are a series-coupled plurality of FETs that form a first FET stack 112 that is coupled between the first node 102 and the second node 104. The first FET 106 includes a first body and a first gate. Likewise, the second FET 108 includes a second body and a second gate.

In accordance with the embodiments described herein, the first compensation circuit 110 is implemented to electrically couple the first body of the first FET 106 to the second gate of the second FET 108. This electrical coupling of the first body to the second gate through the first compensation circuit 110 facilitates an equalization of voltages across the first series-coupled plurality of FETs 112. Specifically, the first compensation circuit includes 110 is configured to compensate for the effects of the parasitic leakage currents in a way that can equalize the source-drain voltages across each of the first FET 106 and the second FET 108 that occurs when the RF switch 100 is open.

In one embodiment, the first compensation circuit 110 includes one or more components characterized by one or more impedances (i.e., "impedance-providing components"). These one or more impedance-providing components are configured and implemented to compensate for the effects of the parasitic leakage currents in a way that can equalize the source-drain voltages across each of the FETs 106, 108 that occurs when the RF switch 100 is open. In one embodiment, the one or more impedance-providing components can comprise a capacitor. In another embodiment, the one or more impedance-providing components can comprise a varactor. In another embodiment, the one or more impedance-providing components can comprise a resistor-capacitor (RC) series circuit. In another embodiment, the one or more impedance-providing components can comprise an active impedance-providing component, such as a metal oxide semiconductor FET (MOSFET) or metal oxide semiconductor capacitor (MOSCAP) implemented active impedance. In each of these embodiments the impedance-providing component(s) can be selected and implemented so that the impedances equalize the source-drain voltages across each of the FETs 106, 108 that occurs when the RF switch 100 is open. Detailed examples of such compensation circuits 110 will be described in greater detail with reference to FIG. 6.

In some embodiments, the series-coupled plurality of FETs 112 can include additional FETs. As one example, the series-coupled plurality of FETs 112 can include a third FET that includes a third gate and a third body, and a fourth FET that includes a fourth gate and a fourth body. In such an embodiment a second compensation circuit can be provided, where the second compensation circuit electrically couples the third body and the fourth gate. One example of such an embodiment will be discussed in greater detail below with reference to FIG. 3.

As another example, the series-coupled plurality of FETs 112 can include at least a third FET that includes a third gate and a third body. In such an embodiment a second compensation circuit can be provided, where the second compensation circuit electrically couples the second body and the third gate. One example of such an embodiment will be discussed in greater detail below with reference to FIG. 4.

In yet other embodiments the RF switch can include additional FET stacks coupled between additional nodes. And each of these additional FET stacks can include a series-coupled plurality of FETs with additional compensation circuits coupled between various gates and bodies in the additional FET stacks.

For example, in one embodiment the RF switch 100 can further comprise a second FET stack coupled between a third node and a fourth node. This second FET stack can include a second series-coupled plurality of FETs, wherein the second series-coupled plurality of FETs includes a third FET and a fourth FET. In this embodiment the third FET can include a third gate and a third body. Likewise, in this embodiment the fourth FET can include a fourth gate and a fourth body. And in this embodiment a second compensation circuit can be provided, where the second compensation circuit electrically couples the third body and the fourth gate. In this embodiment the second compensation circuit likewise includes impedances that can be selected and implemented to equalize the source-drain voltages across each of the third FET and the fourth FET. Examples of RF switches that include multiple FET stacks will be described in greater detail with reference to FIGS. 7 and 8.

The various FET stacks can be implemented with a variety of different types of FETs. For example, the FET stack 112 can be implemented with GaAs or GaN FETs, to give two nonlimiting examples.

Figure 2:
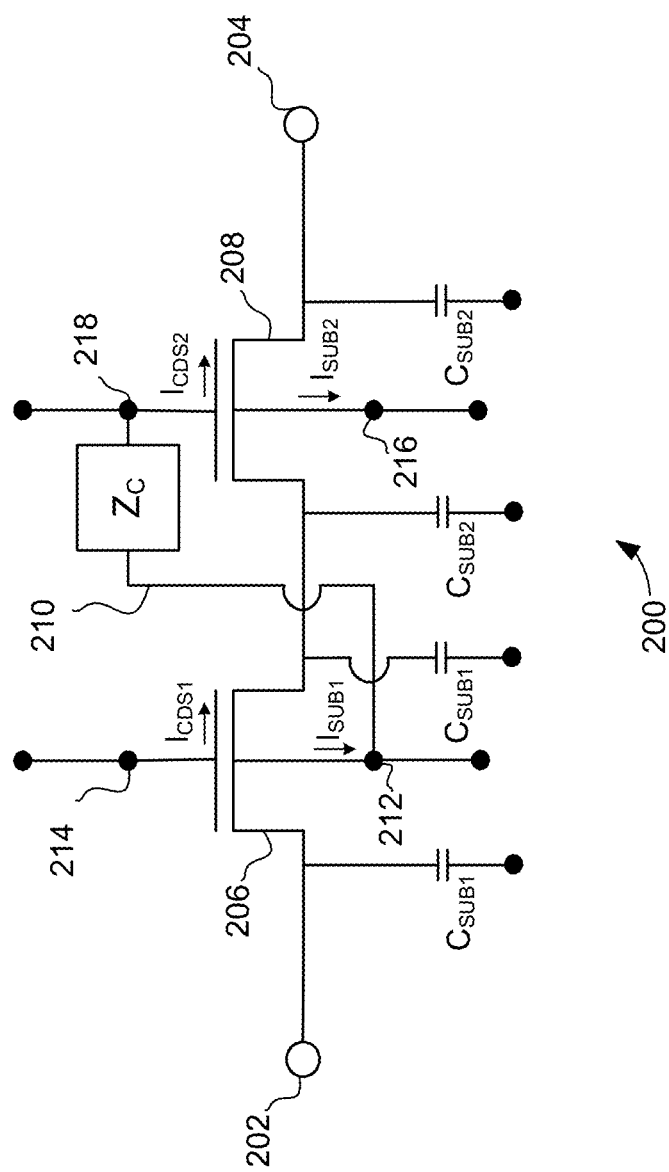
FIG. 2 is a circuit diagram of an FET stack in accordance with an exemplary embodiment.

Turning now to FIG. 2, a circuit diagram of a FET stack 200 in accordance with an embodiment is illustrated. The FET stack 200 is exemplary of the type of FET stack that can be implemented in an RF switch in accordance with the various embodiments described herein. The FET stack 200 includes a first FET 206, a second FET 208, and a first compensation circuit 210. The first FET 206 and the second FET 208 are a series-coupled plurality of FETs that form the FET stack 200. The FET stack 200 is coupled between a first node 202 and the second node 204. The first FET 206 includes a first body 212 and a first gate 214. Likewise, the second FET 208 includes a second body 216 and a second gate 218.

During operation of the RF switch, the FETs 206, 208 are turned on when the switch is closed (i.e., in an active or current-conducting state) to allow current to conduct from first node 202 to second node 204 (and from the second node 204 to the first node 202). Conversely, the FETs 206, 208 are turned off when the switch is open to prevent current from conducting from the first node 202 to the second node 204 (and from the second node 204 to the first node 202). However, even when the FETs 206, 208 are turned off there will be some source-drain leakage current ($I_{CDS}$) that flows across the source-drain of each FET. Furthermore, there will be some body-substrate parasitic leakage current ($I_{SUB}$) that flows from the body of each FET to the underlying substrate.

Specifically, each of the FETs 206, 208 includes a parasitic capacitance $C_{SUB}$ between the body of the FET and the underlying substrate. When the FETs 206, 208 are turned off some body-substrate parasitic leakage current ($I_{SUB}$) still flows through the parasitic capacitance $C_{SUB}$ of each of the FETs 206, 208 to the substrate.

In the example of FIG. 2 a source-drain leakage current $I_{CDS1}$ flows through FET 206 and a source-drain leakage current $I_{CDS2}$ flows through FET 208. Likewise, a body-substrate parasitic leakage current $I_{SUB1}$ flows from FET 206 and a body-substrate parasitic leakage current $I_{SUB2}$ flows from FET 208.

The existence of the body-substrate parasitic leakage currents ($I_{SUB1}$, $I_{SUB2}$) necessarily causes the source-drain leakage currents ($I_{CDS1}$, $I_{CDS2}$) to be unequal. Furthermore, the voltage across each of the FETs 206, 208 when the switch is open is determined in part by the source-drain leakage currents. For example, the drain-source voltage $V_{DS}$ across a FET when the FET is turned off to open the switch can be expressed as:

$$V_{DS} = I_{CDS} \frac{1}{j\omega C_{DS}}$$

where $C_{DS}$ is the drain-source capacitance of the FET. Thus, the unequal amount of source-drain leakage currents ($I_{CDS1}$, $I_{CDS2}$) caused by body-substrate parasitic leakage currents ($I_{SUB1}$, $I_{SUB2}$) will cause the drain-source voltages $V_{DS}$ of the FETs 206, 208 to be unequal. These unequal voltages across the FETs 206, 208 will result in higher source-drain voltages across one FET that can exceed its breakdown voltage and potentially fail while the other FET with lower source-drain voltages is still below their breakdown voltage. These unequal voltages across the FETs 206, 208 can thus reduce the voltage handling capacity of the overall FET stack 200.

In accordance with the embodiments described herein, the first compensation circuit 210 is implemented to electrically couple the first body 212 of the first FET 206 to the second gate 218 of the second FET 208. This electrical coupling of the first body 212 to the second gate 218 through the first compensation circuit 210 facilitates an equalization of voltages across the FET stack 200 that can improve the voltage handling capacity of the FET stack 200. Specifically, the first compensation circuit 210 is configured to compensate for the effects of the body-source parasitic leakage currents ($I_{SUB1}$, $I_{SUB2}$) in a way that can equalize the drain-source voltages (VD's) across each of the first FET 206 and the second FET 208. To facilitate this, the first compensation circuit 210 includes one or more components configured by an impedance $Z_C$. The impedance $Z_C$ is configured and implemented to compensate for the effects of the body-source parasitic leakage currents ($I_{SUB1}$, $I_{SUB2}$) in a way that can equalize the drain-source voltages across each of the FETs 206, 208 that occurs when FETs are turned off to provide an open circuit between the first node 202 and the second node 204. As described above, in various embodiments, the impedance $Z_C$ can comprise a capacitor, varactor, resistor-capacitor (RC) series circuit, active impedance, etc. These various embodiments of impedance $Z_C$ will be discussed in greater detail down below.

As described above, in some embodiments, the FET stacks can include additional FETs and additional compensation circuits. Turning now to FIG. 3A, a circuit diagram of a FET stack 300 in accordance with another embodiment is illustrated. The FET stack 300 is exemplary of the type of FET stack that can be implemented in an RF switch in accordance with the various embodiments described herein. The FET stack 300 includes a first FET 306, a second FET 308, a third FET 307, a fourth FET 309, a first compensation circuit 310, and a second compensation circuit 311. The first FET 306, second FET 308, third FET 307, and fourth FET 309 are series-coupled plurality of FETs that form the FET stack 300. The FET stack 300 is coupled between a first node 302 and the second node 304. The first FET 306 includes a first body 312 and a first gate 314. Likewise, the second FET 308 includes a second body 316 and a second gate 318. Likewise, the third FET 307 includes a third body 313 and a third gate 315. Finally, the fourth FET 309 includes a fourth body 317 and a fourth gate 319.

During operation of the RF switch, the FETs 306, 308, 307, 309 are turned on when the switch is closed to allow current to conduct from first node 302 to second node 304 (and from the second node 304 to the first node 302). Conversely, the FETs 306, 308, 307, 309 are turned off when the switch is open to prevent current from conducting from the first node 302 to the second node 304 (and from the second node 304 to the first node 302).

However, as was described above, even when the FETs 306, 308, 307, 309 are turned off there will be some source-drain leakage current ($I_{CDS}$) that flows across the source-drain of each FET. Furthermore, there will be some body-substrate parasitic leakage current ($I_{SUB}$) that flows from the body of each FET to the underlying substrate. The existence of the body-substrate parasitic leakage currents necessarily causes the source-drain leakage currents to be unequal, which in turn can cause the voltage across each of the FETs 306, 308, 307, 309 to be unequal. These unequal voltages across the FETs 306, 308, 307, 309 can result in higher source-drain voltages across one FET that can exceed its breakdown voltage and potentially fail and thus reduce the voltage handling capacity of the overall FET stack 300.

In accordance with the embodiments described herein, the first compensation circuit 310 is implemented to electrically couple the first body 312 of the first FET 306 to the second gate 318 of the second FET 308. Likewise, the second compensation circuit 311 is implemented to electrically couple the third body 313 of the third FET 307 to the fourth gate 319 of the fourth FET 309. These electrical couplings facilitate an equalization of voltages across the FET stack 300 that can improve the voltage handling capacity of the FET stack 300. Specifically, the first compensation circuit 310 and the second compensation circuit 311 are configured to compensate for the effects of the body-source parasitic leakage currents in a way that can equalize the drain-source voltages across each of the FETs 306, 308, 307, 309. To facilitate this, the first compensation circuit 310 includes an impedance $Z_{C1}$ and the second compensation circuit 311 includes an impedance $Z_{C2}$. These impedances $Z_{C1}$ and $Z_{C2}$ are configured and implemented to compensate for the effects of the body-source parasitic leakage currents ($I_{SUB1}$, $I_{SUB2}$) in a way that can equalize the drain-source voltages across each of the FETs 306, 308, 307, 309 that occurs when FETs are turned off to provide an open circuit between the first node 302 and the second node 304. As described above, in various embodiments, the impedances $Z_{C1}$ and $Z_{C2}$ can comprise a capacitor, varactor, RC series circuit, active impedance, etc. These various embodiments of impedance $Z_{C1}$ and $Z_{C2}$ will be discussed in greater detail down below.

It should be noted that in the FET stack 300 there is not a compensation circuit between all FETs in the FET stack 300. However, in other embodiments additional compensation circuits can be provided. Turning now to FIG. 3B, a circuit diagram of a FET stack 320 in accordance with another embodiment is illustrated. The FET stack 320 includes a first FET 306, a second FET 308, a third FET 307, a fourth FET 309, a first compensation circuit 310, a second compensation circuit 311, and a third compensation circuit 321.

In accordance with the embodiments described herein, the first compensation circuit 310 is implemented to electrically couple the first body 312 of the first FET 306 to the second gate 318 of the second FET 308. Likewise, the second compensation circuit 311 is implemented to electrically couple the third body 313 of the third FET 307 to the fourth gate 319 of the fourth FET 309. Likewise, the third compensation circuit 321 is implemented to electrically couple the second body 316 of the second FET 308 to the third gate 315 of the third FET 307.

Again, these electrical couplings facilitate an equalization of voltages across the FET stack 320 that can improve the voltage handling capacity of the FET stack 320. Specifically, the compensation circuits 310, 311 and 321 are configured to compensate for the effects of the body-source parasitic leakage currents in a way that can equalize the drain-source voltages across each of the FETs 306, 308, 307, 309. To facilitate this, the compensation circuits 310, 311 and 321 include impedances $Z_{C1}$, $Z_{C2}$, $Z_{C3}$ that are implemented to compensate for the effects of the body-source parasitic leakage currents. Again, various embodiments of impedance $Z_{C1}$, $Z_{C2}$ and $Z_{C3}$ will be discussed in greater detail down below.

It next be noted that the compensation circuits can be configured to connect the body and gates of non-adjacent FETs in the FET stack. In these embodiments the compensation circuit can skip over one or between FETs to connect the body and gate and separated FETs in the stack. Turning now to FIG. 3C, a circuit diagram of a FET stack 320 in accordance with another embodiment is illustrated. The FET stack 320 includes a first FET 306, a second FET 308, a third FET 307, a fourth FET 309 and a first compensation circuit 332. Notably, in this embodiment the first compensation circuit 332 connects the body and gate of non-adjacent FETs in the FET stack 330 and thus the first compensation circuit 332 effectively skips over the second FET 308. And again, the first compensation circuit 332 includes an impedance $Z_C$ implemented to compensate for the effects of the body-source parasitic leakage currents.

As described above, the various compensation circuits (e.g., compensation circuits 110, 210, 310, 311, 321, 332) are each implemented with an impedance configured to at least partially compensate for the effects of the body-source parasitic leakage currents and equalize the drain-source voltages across the FETs in the FET stack when those FETs are turned off to provide an open circuit. And as described above, in various embodiments the impedances can comprise a capacitor, varactor, RC series circuit, active impedance, etc.

Figure 4C:
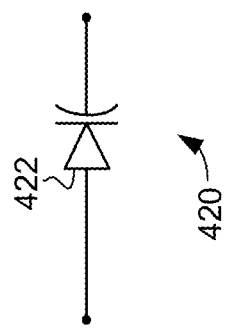
FIGS. 4A, 4B, and 4C are circuit diagrams of compensation circuits in accordance with exemplary embodiments.
Figure 4B:
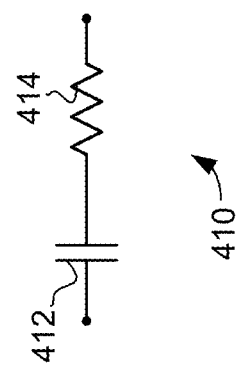
Figure 4A:
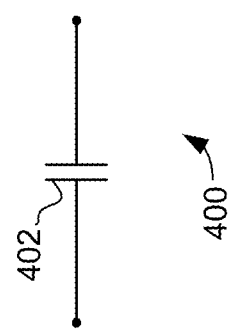

Turning now to FIG. 4A, a circuit diagram of an exemplary compensation circuit 400 (e.g., an instance of circuit 210, 310, 311, 321, 332) in accordance with a first embodiment is illustrated. In this embodiment, the compensation circuit 400 includes an impedance provided with a capacitor 402 (i.e., capacitor 402 is an impedance-providing component). Such a capacitor 402 can implemented with any suitable type of capacitor, including discrete devices and integrated passive devices (IPDs) such as metal-insulator-metal (MIM) capacitors. In other embodiments, the capacitor 402 can be implemented with a capacitive assembly (e.g., a low-temperature co-fired ceramic (LTCC) assembly). In yet other embodiments the capacitor 402 can be implemented as an active impedance capacitor, such as a MOSCAP or other such device.

In each of these embodiments the capacitor 402 can be implemented to compensate for the effects of the body-source parasitic leakage currents. In such embodiments the capacitive value of the capacitor 402 needed to provide the desired compensation can be determined using computer simulations. For example, the capacitor 402 value is can be determined by computer simulations implemented to select values that result in a uniform voltage distribution across each of the FETs. Specifically, these computer simulations can be repeatedly performed using different combinations of capacitors with different capacitive values in the various compensation circuits of the FET stack until the desired voltage uniformity across the FET stack is obtained. In one exemplary embodiment the capacitor 402 has a capacitance between 20 femtofarads and 5 picofarads.

Turning now to FIG. 4B, a circuit diagram of an exemplary compensation circuit 410 (e.g., an instance of circuit 210, 310, 311, 321, 332) in accordance with a second embodiment is illustrated. In this embodiment, the compensation circuit 410 includes impedances provided in an RC series circuit that includes a capacitor 412 and a resistor 414 (i.e., capacitor 412 and resistor 414 are impedance-providing components). Again, such a capacitor 412 and resistor 414 can implemented with any suitable type of capacitor and resistor, including a variety of integrated passive devices. And again, in such embodiments the capacitive value of the capacitor 412 and the resistive value of the resistor 414 can be determined using computer simulations. Specifically, these computer simulations can again be repeatedly performed using different combinations of capacitors and resistors with different impedance values in the various compensation circuits of the FET stack until the desired voltage uniformity across the FET stack is obtained. In one exemplary embodiment the capacitor 412 has a capacitance between 20 femtofarads and 5 picofarads, and the resistor 414 has a resistance between 5 kiloohms and 100 kiloohms.

Turning now to FIG. 4C, a circuit diagram of an exemplary compensation circuit 420 (e.g., an instance of circuit 210, 310, 311, 321, 332) in accordance with a third embodiment is illustrated. In this embodiment, the compensation circuit 420 includes an impedance provided with a varactor 422 (i.e., varactor 422 is an impedance-providing component). In general, a varactor is a variable capacitance diode that can be implemented to provide a selectable capacitance. In some embodiments the varactor 422 can be implemented to be adjustable using a third node. This ability of adjust the capacitance can be used for operational tuning of the RF switch. The varactor 422 can implemented with any suitable type of varactor.

Figure 5:
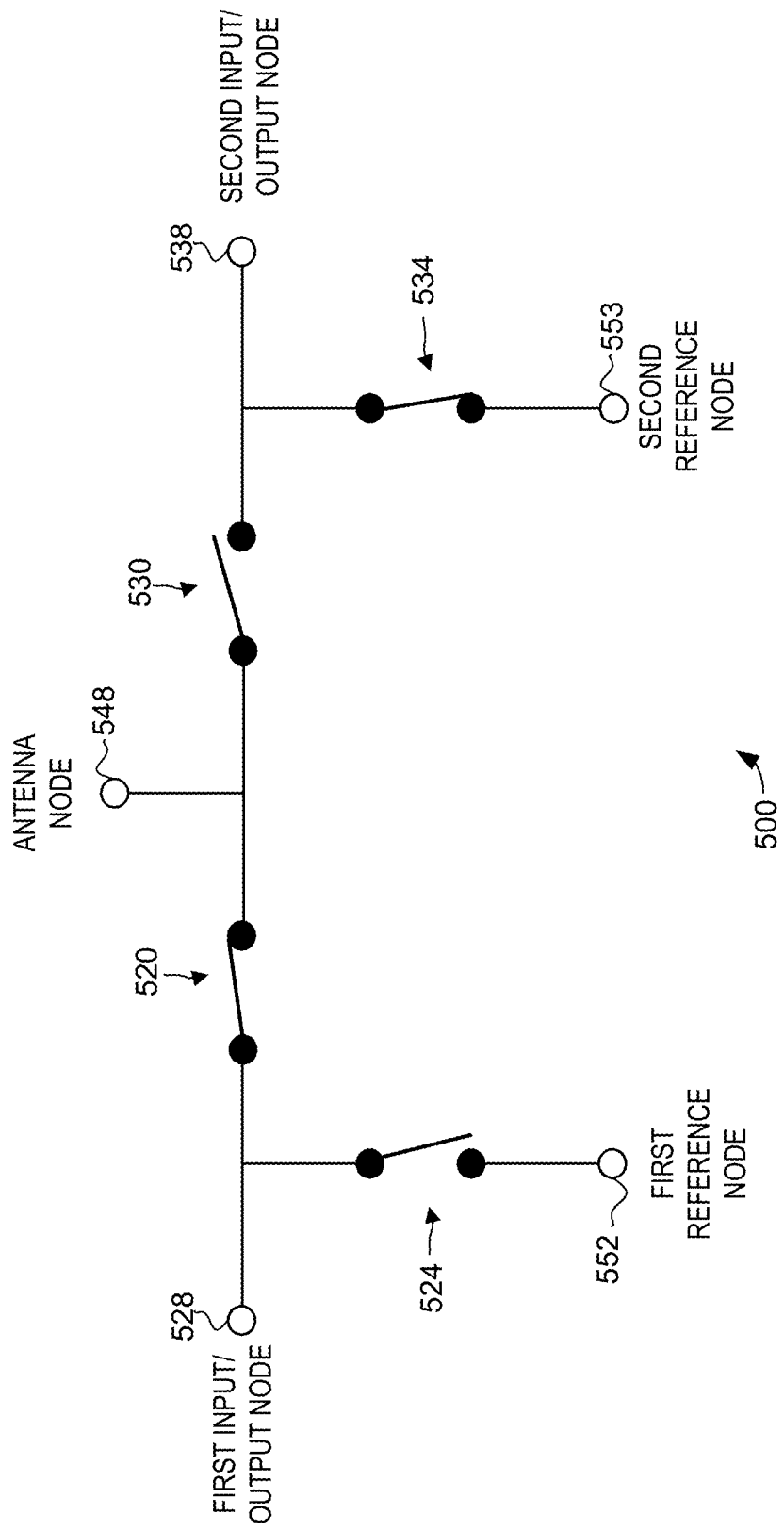
FIG. 5 is a circuit diagram of an RF switch in accordance with an exemplary embodiment.

Turning to FIG. 5, a simplified circuit diagram of an RF switch 500 in accordance with an exemplary embodiment is illustrated. The RF switch 500 includes a plurality of input/output (I/O) nodes, including first I/O node 528 and second I/O node 538. The RF switch 500 further includes an antenna node 548, a first reference node 552 and a second reference node 553. RF switch 500 further includes a plurality of switches 520, 524, 530, 534 electrically coupled between the various nodes 528, 538, 548, 552, 553. As was described above, one or more of the switches 520, 524, 530, 534 may be implemented as a stack of FETs.

In accordance with the embodiments described herein, one or more the FET stacks used to implement the switches 520, 524, 530, 534 can include compensation circuits (e.g., compensation circuits 110, 210, 310, 311, 321, 332, 400, 410, 420) configured between one or more FET bodies and gates. And as described above these compensation circuits are implemented to electrically couple the bodies and gates in a way compensates for the effects of the body-source parasitic leakage currents and equalize the drain-source voltages across the FETs in one or more of the switches 520, 524, 530, 534.

Figure 6:
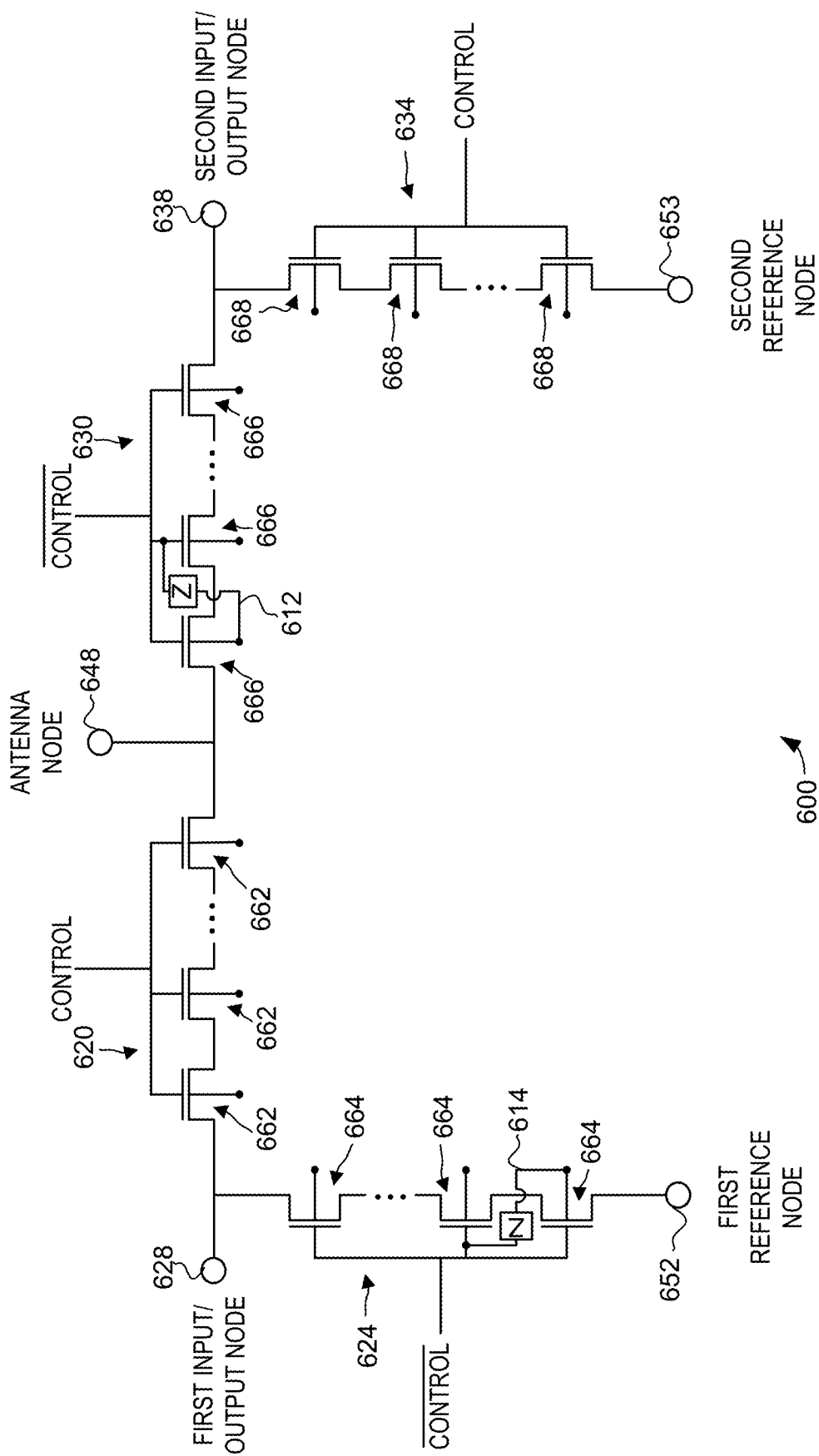
FIG. 6 is a circuit diagram of an RF switch in accordance with an exemplary embodiment.

Turning to FIG. 6, a more detailed circuit diagram of an RF switch 600 in accordance with an exemplary embodiment is illustrated. In this illustrated example, the RF switch 600 again includes a plurality of input/output nodes, including first I/O node 628 (e.g., a transmit node) and second I/O node 638 (e.g., a receive node). The RF switch 600 further includes an antenna node 648, a first reference node 652 and a second reference node 653. The RF switch 600 further includes a plurality of switches 620, 624, 630, 634 electrically coupled between the various nodes 628, 638, 648, 652, 653. In this illustrated embodiment each of the switches 620, 624, 630, 634 are implemented as a stack of FETs.

Specifically, switch 630 is implemented as a first stack of series-coupled FETs 666 that are electrically coupled between the antenna node 648 and the I/O node 638. Likewise, switch 620 is implemented as a second stack of series-coupled FETs 662 that are electrically coupled between the I/O node 628 and antenna node 648. Switch 624 is likewise implemented as a third stack of series-coupled FETs 664 that are electrically coupled between the I/O node 628 and first reference node 652. Finally, switch 634 is likewise implemented as a fourth stack of series-coupled FETs 668 that are electrically coupled between the I/O node 638 and second reference node 653. It should be noted that while the first reference node 652 and the second reference node 653 would typically be coupled to a ground reference (e.g., zero volts), the nodes could alternatively be coupled to a positive or negative DC voltage reference.

As used herein, the term "series-coupled," in reference to the electrical coupling between multiple FETs in a stack, means that the output terminals (e.g., source/drain terminals) of the multiple FETs are connected together to provide a continuous electrically conductive channel/path between an input node (e.g., I/O node 628) and an output node (e.g., antenna node 648) when the multiple FETs are in a conducting state (e.g., "on" or "closed"). For example, in a series-coupled sequence of FETs a source terminal for one FET may be coupled to the drain terminal of the adjacent FET.

In FIG. 6, each of the switches 620, 624, 630, 634 of FETs is shown to include three series-coupled FETs 662, 664, 666, 668. However, this is just one example implementation. In other embodiments each of the switches 620, 624, 630, 634 may alternatively include less than three FETs or more than three FETs (as indicated with the ellipses in each FET stack). Furthermore, each of the switches 620, 624, 630, 634 may include a same number of FETs or may instead include different numbers of FETs.

In this illustrated example each of the FETs 662, 664, 666, 668 includes a gate terminal (or control terminal), an input terminal (e.g., a drain/source terminal), an output terminal (e.g., a source/drain terminal), and a body terminal. As typical with FETs, the conductivity of the channel between source/drain terminals for each of the FETs 662, 664, 666, 668 may be controlled by the application of appropriate voltages to the corresponding gate terminal.

To facilitate operation, the RF switch 600 is controlled using a control signal (CONTROL) and an inverse control signal (CONTROL). Specifically, the control signal is used to control switches 620 and 634 and the inverse control signal is used to control switches 624 and 630. To facilitate this, the control signal is applied to the gate terminals of the FETs 662 and 668, and the inverse control signal is applied to the gate terminals of FETs 664 and 666. Typically, the control signals and inverse control signals provided to each gate in any particular switch 620, 624, 660, 634 are synchronous, in that they simultaneously cause all of the FETs in that stack either to be substantially conducting (e.g., "on" or "closed") or substantially non-conducting (e.g., "off" or "open"). However, it should be noted that in other embodiments the control signals and inverse control signals may be asynchronous.

During typical operation the RF switch 600 is operated to alternate between coupling an RF transmit signal provided by a transmitter (not shown) coupled to I/O node 628 to the antenna node 648 and coupling an RF receive signal provided by the antenna at antenna node 648 to a receiver (not shown) coupled to I/O node 638. Specifically, in the transmit state, switches 620 and 634 are closed, and switches 624 and 630 are open. Specifically, in the transmit state the control signal applied to the gate terminals of FETs 662 and 668 causes those FETs to be in a substantially conducting state, while the inverse control signal applied to the gate terminals of FETs 664 and 666 causes those FETs to be in a substantially non-conducting state. Accordingly, in the transmit state, signal energy present at I/O node 628 is conveyed through switches 620 to antenna node 648, and the conductive path between I/O node 628 and reference node 652 is open. In addition, in the transmit state, signal energy present at I/O node 638 is conveyed through switches 634 to reference node 653, and the conductive path between I/O node 638 and antenna node 648 is open.

Conversely, in the receive state, switches 630 and 624 are closed, and switches 620 and 634 are open. Specifically, in the receive state the inverse control signal applied to the gate terminals of FETs 664 and 666 causes those FETs to be in a substantially conducting state, while the control signal applied to the gate terminals of FETs 662 and 668 causes those FETs to be in a substantially non-conducting state. Accordingly, in the receive state, signal energy present at antenna node 648 is conveyed through switches 630 to I/O node 638, and the conductive path between I/O node 638 and ground reference node 653 is open. In addition, in the receive state, signal energy present at I/O node 628 is conveyed through switches 624 to ground reference node 652, and the conductive path between I/O node 628 and the antenna node 648 is open.

The RF switch 600 can be implemented in variety of devices and structures. For example, in one embodiment the RF switch 600 is monolithic with FETs 662, 664, 666, and 668 formed in and on a single integrated circuit substrate (e.g., on a single semiconductor die). For example, according to one embodiment the RF switch IC 600 may be formed on a silicon-on-insulator (SOI) substrate. In other embodiments the RF switch IC 600 may be formed on a gallium arsenide (GaAs)-based substrate. In other embodiments other substrates may be used including other silicon (Si)-based substrates (e.g., bulk Si) and gallium nitride (GaN)-based substrates (e.g., GaN on silicon, GaN on silicon carbide (SiC), and so on).

To implement switches 620, 624, 630, and 634 a variety of different types of FETs can be used. For example, one or more of the FETs 662, 664, 666, and 668 may be implemented with multi-gate FETs, although some of the FETs may be single-gate FETs, as well. Furthermore, in one embodiment the one or more of the FETs 662, 664, 666, and 668 may be implemented with pseudomorphic high electron mobility transistors (pHEMTs). In other embodiments one or more of the FETs 662, 664, 666, and 668 may be implemented in a variety of differently configured, gate-controlled, three-terminal components or transistors, including differently-configured pHEMTs, metal oxide semiconductor FETs (MOSFETs), high electron mobility transistors (HEMTs), metal-semiconductor field effect transistors (MESFETs), laterally diffused metal-oxide semiconductor (LDMOS) FETs, Enhancement-mode MOSFETs (EMOSFETs), and junction gate FETs (JFETs), to name a few.

In accordance with the embodiments described herein the RF switch 600 includes at least a first compensation circuit 612 and a second compensation circuit 614. The first compensation circuit 612 couples a body of a first FET 666 to a gate of a second FET 666. Likewise, the second compensation circuit 614 couples a body of a first FET 664 to a gate of a second FET 664. Again, these compensation circuits 612 and 614 include impedances $Z_C$ configured to compensates for the effects of the body-source parasitic leakage currents and equalize the drain-source voltages across the FETs 666 and 664.

In another embodiment the RF switch 600 includes a first plurality of compensation circuits 612, each of the first plurality of compensation circuits 612 coupling a gate on one FET 666 in the first series-coupled plurality of FETs 666 to a body on another one of the first series-coupled plurality of FETs 666. The RF switch 600 can also include a second plurality of compensation circuits 614, each of the second plurality of compensation circuits 614 coupling a gate on one FET 664 in the second series-coupled plurality of FETs 664 to a body on another one of the second series-coupled plurality of FETs 664.

Figure 7A:
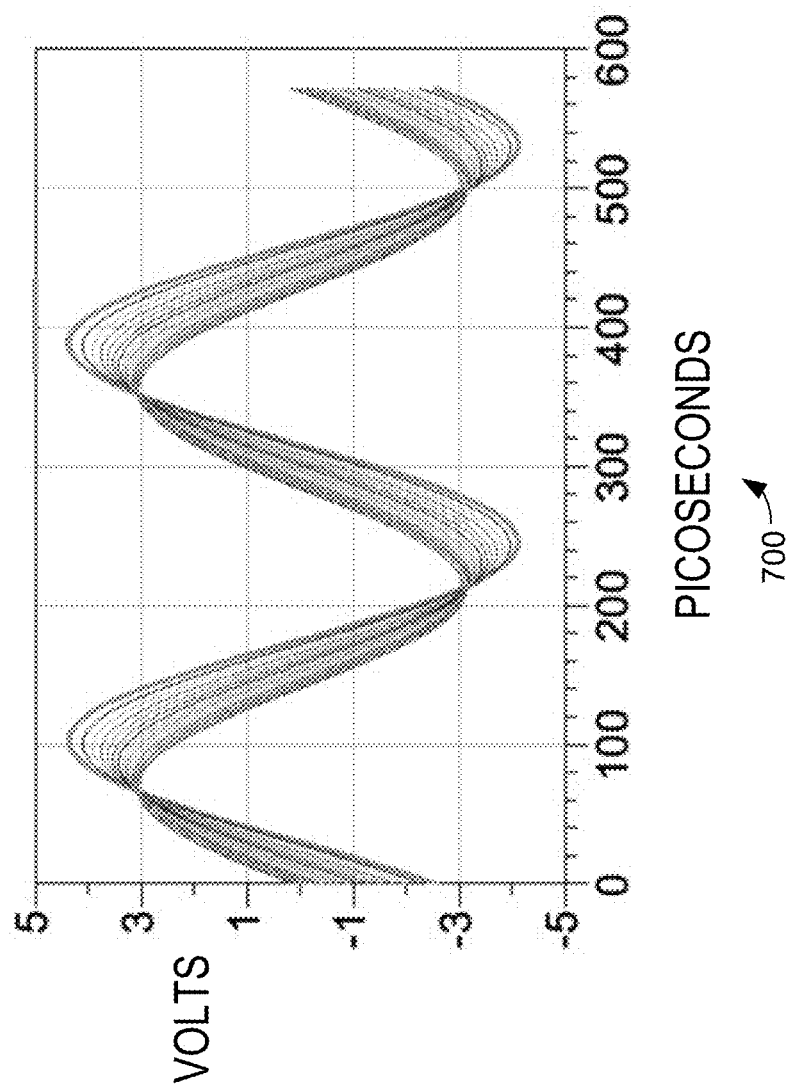
FIGS. 7A and 7B are graphical representations of voltage waveforms in FET stacks in accordance with exemplary embodiments.

Turning now to FIG. 7A, graph 700 shows exemplary voltage waveforms as would be present across FETs in an exemplary FET stack. Specifically, each of the waveforms in the graph 700 illustrates an exemplary voltage across one FET in a stack in FETs when the FETs are turned off to provide an open circuit and while an RF voltage is present on one side of the FET stack.

Specifically, graph 700 depicts the waveform amplitudes and resulting potential difference between the drain and source nodes of the different FETs in the FET stack. As can be seen in graph 700, the voltage amplitudes across the different FETs in the FET stack have significant variation from FET to FET. Specifically, in this example, some FETs have a drain source voltage of as much as 4.2 volts, while other FETs in the same stack have a drain source voltage of as little as 3.0 volts. Thus, the FETs in graph 700 have non-uniformity variation of 1.2 volts.

As was described above, this variation in voltages across the FETs can be caused in part by an unequal amount of source-drain leakage currents resulting from body-substrate parasitic leakage currents. This variation can cause the voltage across some FETs to exceed the breakdown voltage and potentially fail while other FETs with lower source-drain voltages are still below their breakdown voltage. As one example, each of the FETs in the stack can have a breakdown voltage of 3.6 volts as determined by the semiconductor fabrication used to form the FETs. In such an embodiment the variation illustrated in graph 700 will likely result in the source drain voltages across one or more FETs being significantly above 3.6 volts. Thus, one or more of the FETs is likely to enter the beak down region during operation of the switch. Thus, these relatively large variations in voltage waveforms across the FETs can reduce the voltage handling capacity of the overall FET stack.

Figure 7B:
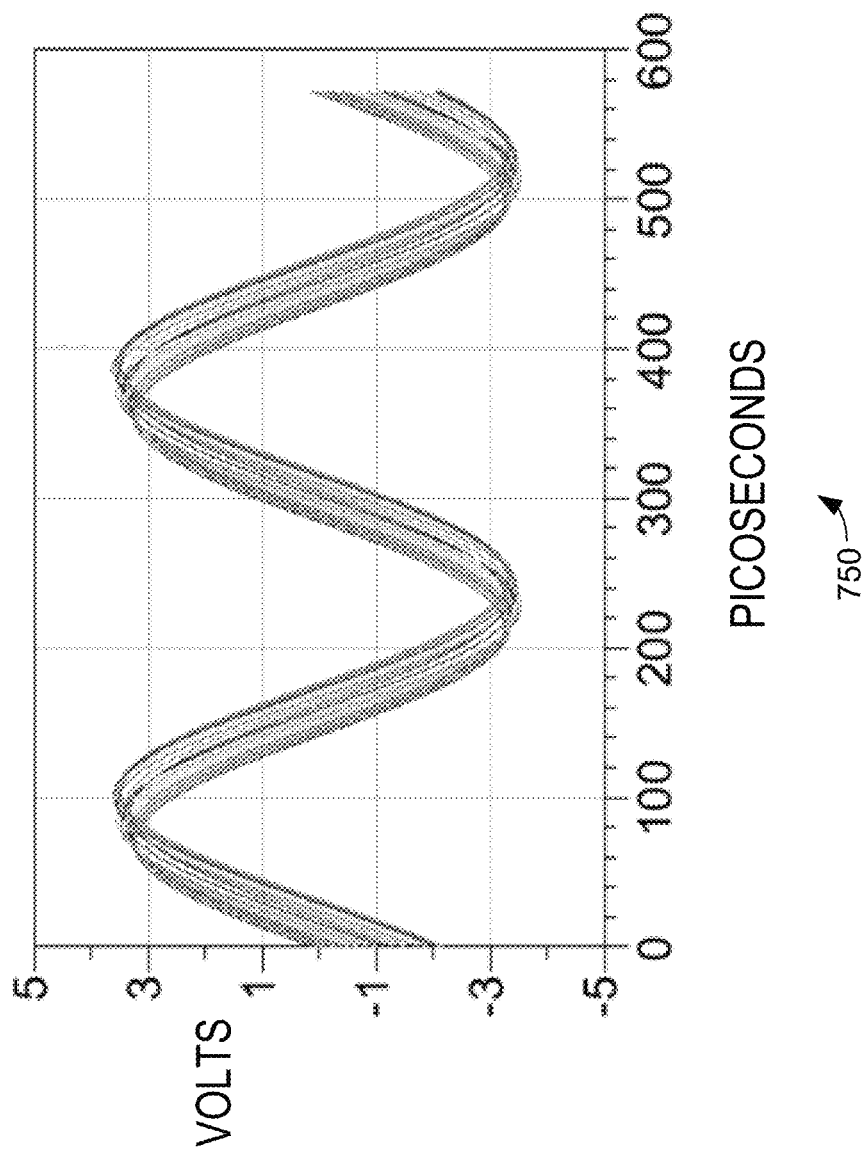

Turning now to FIG. 7B, graph 750 shows exemplary voltage waveforms as would be present across FETs in an exemplary FET stack that includes one or more compensation circuits in accordance with the embodiments described herein (e.g., FET stacks 112, 200, 300, 320, 330) where the FET stack can implement one or more RF switches (e.g., switches 620, 624, 630, 634). As can be seen in graph 750 the amplitude variation in the voltage waveform across the FETs is significantly reduced by the compensation circuits. Specifically, in the example of graph 750 the voltage waveforms have a maximum amplitude variation of 0.67 volts, and a maximum voltage across one FET of 3.596 volts, which is well below the breakdown voltage of many typical FETs used in FET stacks. This reduced variation in voltage waveforms across the FETs can thus increase the voltage handling capacity of the overall FET stack.

Figure 8:
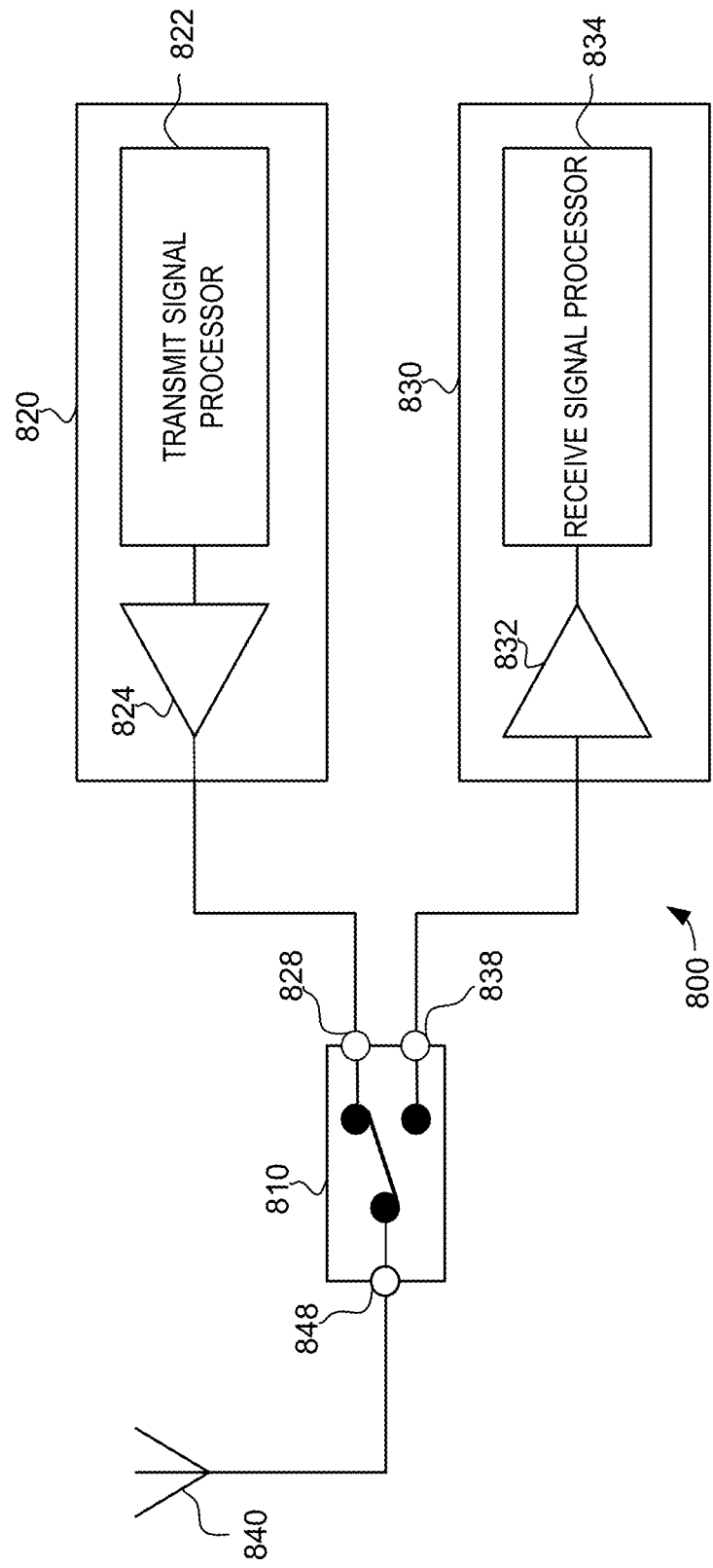
FIG. 8 is a simplified block diagram of an RF transceiver system.

Turning now to FIG. 8 a simplified block diagram of an example of a radio frequency (RF) transceiver system 800 is illustrated. The RF transceiver system includes an RF switch 810, a transmitter 820, a receiver 830, and an antenna 840. Transceiver system 800 is a half-duplex transceiver, in which only one of the transmitter 820 or the receiver 830 are coupled, through the RF switch 810, to the antenna 840 at any given time. More specifically, the state of the RF switch 810 is controlled with a control signal to alternate between coupling an RF transmit signal produced by the transmitter 820 to the antenna 840, or coupling an RF receive signal received by the antenna 840 to the receiver 830.

The transmitter 820 may include, for example, a transmit (TX) signal processor 822 and a power amplifier 824. The transmit signal processor 822 is configured to produce transmit signals, and to provide the transmit signals to the power amplifier 824. The power amplifier 824 amplifies the transmit signals, and provides the amplified transmit signals to the RF switch 810. The receiver 830 may include, for example, a receive amplifier 832 (e.g., a low noise amplifier) and a receive (RX) signal processor 834. The receive amplifier 832 is configured to amplify relatively low power received signals from the RF switch 810, and to provide the amplified received signals to the receive signal processor 834. The receive signal processor 834 is configured to consume or process the receive signals.

During each transmit time interval, the RF switch 810 is controlled to be in a first or "transmit" state, as depicted in FIG. 8, in which a transmit signal path is closed between transmitter node 828 and antenna node 848, and in which a receive signal path is open between antenna node 848 and receiver node 838. Conversely, during each receive time interval, the RF switch 810 is controlled to be in a second or "receive" state, in which the receive signal path is closed between antenna node 848 and receiver node 838, and in which the transmit signal path is open between transmitter node 828 and antenna node 848.

In accordance with the embodiments described herein, the RF switch 810 includes at least one FET stack (e.g., FET stacks 112, 200, 300, 320, 330, FIGS. 1, 2, 3) that includes at least one compensation circuit (e.g., compensation circuits 110, 210, 310, 311, 321, 332, 400, 410, 420, 612, 614, FIGS. 1, 2, 3, 4, 6). The at least one compensation circuit is implemented with an impedance configured to at least partially compensate for the effects of the body-source parasitic leakage currents and equalize the drain-source voltages across the FETs in the FET stack when those FETs are turned off to provide an open circuit.

The RF transceiver system 800 may be physically implemented using a variety of active and passive electrical devices, which may be housed on one or more printed circuit boards (PCBs) and/or other substrates. To facilitate assembly of such a system, various components of the RF transceiver system 800 may be implemented in self-contained modules or electrical devices, which may be coupled to a PCB that electrically connects the module/devices to other portions of the RF transceiver system 800. As used herein, the term "module" means a set of active and/or passive electrical devices (e.g., ICs and components) that are physically contained within a single housing (e.g., the device(s) are included on a common substrate (referred to herein as a "module substrate") or within a single package. A "module" also includes a plurality of conductive terminals for electrically connecting the set of devices to external circuitry that forms other portions of an electrical system. Essentially, the module substrate configuration, the method of coupling the device(s) to the module's terminals, and the number of devices within the module defines the module type. For example, in various embodiments, a module may be in the form of a surface mount device, a chip carrier device, a ball, pin, or land grid array device, a flat package (e.g., a quad or dual flat package) device, a chip scale packaged device, a system-in-package (SiP) device, or in the form of some other type of integrated circuit package. Although a particular type of module is described below, it is to be understood that embodiments of the inventive subject matter may be included in other types of modules, as well.

Figure 9:
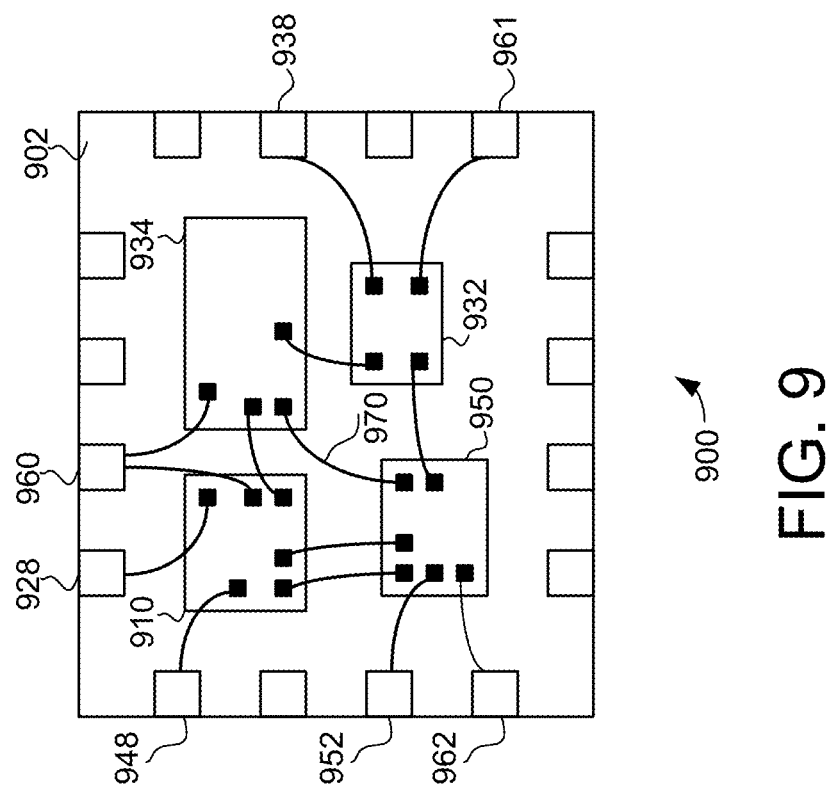
FIG. 9 is a top view of a module that embodies a portion of the RF transceiver system of FIG. 8, in accordance with an embodiment.

For example, turning to FIG. 9, a top view of a module 900 that embodies a portion of the RF transceiver system 800 of FIG. 8, in accordance with an embodiment is illustrated. Module 900 includes a module substrate 902, which may be a relatively small PCB, a conductive flange, or another rigid structure. Module 900 also includes a plurality of ICs coupled to the module substrate 902, including an RF switch integrated circuit (IC) 910 (e.g., an IC that embodies RF switch 100, 600, 810), a receive amplifier IC 932 (e.g., receive amplifier 832, FIG. 8), a receive matching circuit IC 934, and an RF switch controller IC 950. In addition, module 900 includes a transmit signal input terminal 928 (e.g., corresponding to transmitter node 828, FIG. 8), a receive signal output terminal 938 (e.g., corresponding to receiver node 838, FIG. 8), an antenna terminal 948 (e.g., corresponding to antenna terminal 848, FIG. 8), a transmit/receive (TX/RX) control signal terminal 952, one or more ground terminals 960, 961, and one or more power terminals 962. The various ICs 910, 932, 934, 950 and terminals 928, 938, 948, 952, 960-962 are electrically connected together through a plurality of wirebonds (e.g., wirebond 970). In other embodiments, various ones of the ICs 910, 932, 934, 950 and terminals 928, 938, 948, 952, 960-962 may be electrically connected together using other conductive structures (e.g., conductive traces on and within module substrate 902 and/or conductive vias through module substrate 902). In various embodiments, the module 900 may be housed in an air-cavity package or an overmolded (e.g., encapsulated) package, although the module 900 may be considered to be complete without such packaging, as well.

After incorporation of module 900 into a transceiver system (e.g., system 800, FIG. 8), and during operation of the transceiver system, power and ground reference voltages may be provided to module 900 through power and ground terminals 960-962. RF switch controller IC 950 may convert an input power voltage (e.g., +5.0 volts) received through power terminal 962. In addition, RF switch controller IC 950 may receive switch control signals (e.g., TTL level signals) through TX/RX control signal terminal 952. Based on the received switch control signals, the RF switch controller IC 950 provides switch control signals (e.g., the control and inverse control signals discussed above) to control terminals (e.g., gates) of various transistors of the RF switch IC 910. As was described above, the switch control signals determine whether each of the various transistors is in a conducting or non-conducting state at any given time. More specifically, the switch control signals determine whether the RF switch IC 910 is in a transmit state (i.e., a state in which the switch is configured to convey an RF signal from the transmitter to the antenna) or a receive state (i.e., a state in which the switch is configured to convey an RF signal from the antenna to the receiver) at any given time.

When the switch control signals configure the RF switch IC 910 in the transmit state, transmit signals received by the RF switch IC 910 from a power amplifier (e.g., power amplifier 824, FIG. 8) through the transmit signal input terminal 928 are passed through the RF switch IC 910 to the antenna terminal 948. Conversely, when the switch control signals place the RF switch IC 910 in the receive state, signals received from the antenna terminal 948 are passed through the RF switch IC 910 to the receive matching circuit IC 934. The receive matching circuit IC 934 may include one or more integrated passive devices (e.g., capacitors, inductors, and/or resistors). The integrated passive devices, along with inductances of the wirebonds 970 between the receive matching circuit IC 934, the RF switch IC 910, and the receive amplifier IC 932, compose an impedance matching circuit between the RF switch IC 910 and the receive amplifier IC 932. In an alternate embodiment, the receive matching circuit IC 934 may be replaced by discrete components. Either way, the impedance matching circuit also may perform filtering of receive signals that pass from the RF switch IC 910 to the receive amplifier IC 932 through the impedance matching circuit. The receive amplifier IC 932 receives the receive signals from the receive matching circuit IC 934 and amplifies the receive signals. The receive amplifier IC 932 then provides the amplified receive signals to receive signal output terminal 938.

Figure 10:
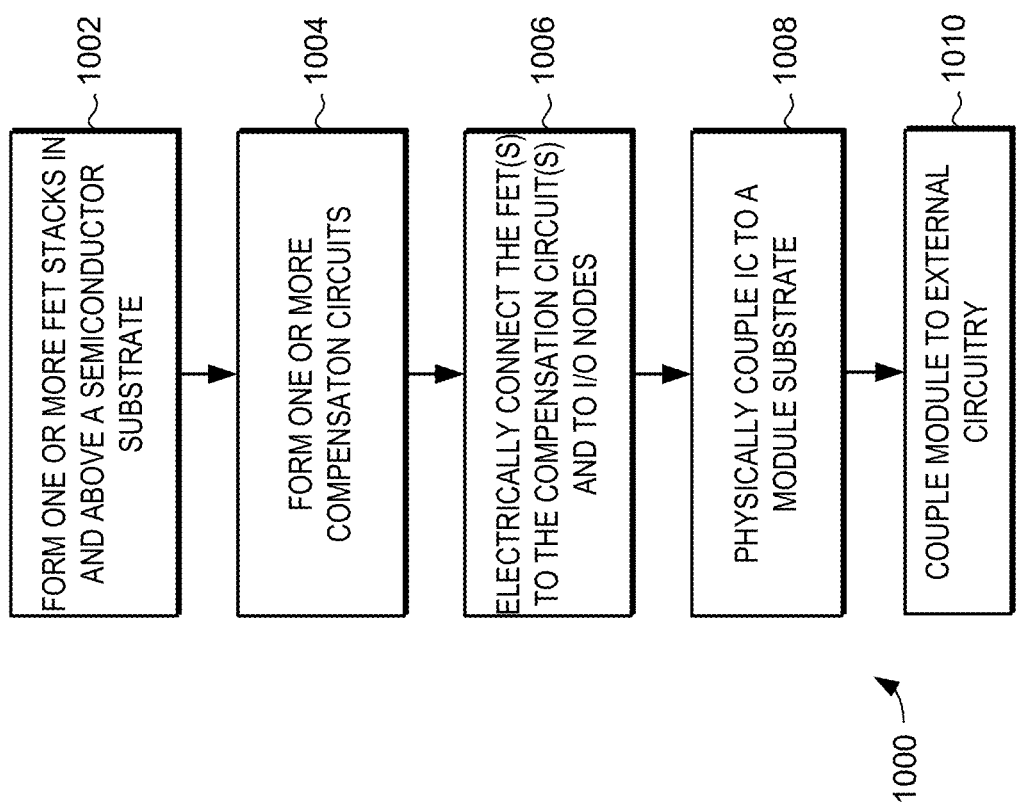
FIG. 10 is a flowchart of a method of fabricating an IC with one or more compensation circuits electrically coupled to FETs, in accordance with an embodiment.

FIG. 10 is a flowchart of a method of fabricating an IC (e.g., RF switch IC 910, FIG. 9) with one or more FETs (e.g., FETs 362, 364, 366, 368, FIG. 6) and one or compensation circuits (e.g., compensation circuits 110, 210, 310, 311, 321, 332, 400, 410, 420, 612, 614, FIGS. 1, 2, 3, 4, 6), in accordance with various embodiments. In a typical IC fabrication process, multiple ICs are fabricated in parallel on a semiconductor wafer, and one of the final fabrication steps includes singulating the individual ICs from the wafer. For simplicity of description, fabrication of a single IC is described below. Those of skill in the art would understand, based on the description herein, that a plurality of ICs may be fabricated simultaneously, as indicated above. Although not specifically pointed out below, when wafer fabrication processes are employed, an IC singulation process may be performed, for example, after block 1004. Similarly, a typical module fabrication process (or IC packaging process) may include simultaneously forming a plurality of modules on a leadframe or PCB, and subsequently singulating each module from the leadframe or PCB. Although also not specifically pointed out below, a module singulation process may be performed, for example, after block 1008.

To facilitate understanding, the below-described method will make reference to fabricating RF switch 600 (FIG. 6). However, those of skill in the art would understand, based on the description herein, that the fabrication embodiments alternatively may be used to fabricate differently configured RF switch ICs or other types of devices altogether. Accordingly, reference to the above-described RF switch IC embodiments should not be construed to limit the scope of the inventive subject matter only to those embodiments.

The method may begin, in block 1002, by forming one or more FETs (e.g., FETs 662, 664, 666, 668, FIG. 6) in and above a semiconductor substrate. In some embodiments, multiple FETs may be formed and electrically interconnected as FET stacks. Generally, each FET includes a gate terminal and a body terminal.

As discussed above, the semiconductor substrate may include any of a variety of different semiconductor substrate materials (e.g., GaAs, GaN, GaN on Si, GaN on SiC, Si, SOI, bulk Si, and so on), and the multi-gate FET(s) may have any of a variety of different structures (e.g., pHEMT, MOSFET, HEMT, MESFET, LDMOS FET, EMOSFET, JFET, and so on). According to an embodiment, prior to forming the FETs, conductive through substrate vias (TSVs) may be formed partially or entirely through the substrate to provide for electrical conductivity between the top and bottom surfaces of the substrate (e.g., between a current conducting terminal of one or more of the FETs and a ground reference node at the bottom of the substrate).

In block 1004, the method may continue by forming one or more compensation circuits (e.g., compensation circuits 110, 210, 310, 311, 321, 332, 400, 410, 420, FIGS. 1, 2, 3, 4, and 6) over the semiconductor substrate. As discussed previously, in various embodiments, the compensation circuits include one or more impedance elements, and various electrical connections between the gates and bodies of the FETs. The impedance elements be integrally-formed passive components (e.g., integrally formed capacitors, resistors, and/or inductors), and/or discrete components (e.g., discrete capacitors, resistors, and/or inductors), in various embodiments.

In block 1006, the method may continue by electrically coupling the gates and bodies of FETs to the compensation circuits and to various I/O nodes (e.g., nodes 102, 104, 528, 538, 548, 552, 553, 628, 638, 648, 652, 653, FIGS. 1, 5, 6). For example, the electrical connections between the FETs and the bias coupling circuits may include integrated electrical connections. Ultimately, during operation, electrical signals may be received through the nodes from external circuitry, and so electrical signals processed through the FET(s) may be provided through the nodes to external circuitry. For example, as discussed previously, the nodes may include a first I/O node, a second I/O node, ground reference nodes, and an antenna node.

In block 1008, the IC (e.g., RF switch IC 910) is physically coupled to a module substrate (e.g., to module substrate 902, FIG. 9). In addition, one or more additional ICs and/or components also may be physically coupled to the module substrate.

In block 1010, the IC(s) and components are electrically coupled to each other, and to terminals that are configured to convey signals, power, and ground references between external circuitry and the IC(s)/components of the module. The module substrate configuration, the method of coupling the IC(s) and components to the module's terminals, and the number of ICs within the module defines the module or package type. The module may then be completed (e.g., by encapsulating the module or containing the module in an air cavity package). Once the module is completed, it may be physically and electrically coupled to external circuitry (e.g., other portions of system 800, FIG. 8).

In one embodiment a radio frequency (RF) switch is provided, comprising: a first FET stack coupled between a first node and a second node, the first FET stack including a first series-coupled plurality of field effect transistors (FETs), wherein the first series-coupled plurality of FETs includes: a first FET, the first FET including a first gate and a first body; and second FET, the second FET including a second gate and a second body; and a first compensation circuit electrically coupling the first body and the second gate.

In another embodiment, a radio frequency (RF) switch is provided, comprising: an antenna node; a transmit node; a receive node; a first reference node; a second reference node; a first field effect transistor (FET) stack coupled between the antenna node and the receive node, the first FET stack including a first series-coupled plurality of FETs, each of the first series-coupled plurality of FETs having a gate and a body, the first FET stack including; a first plurality of compensation circuits, each of the first plurality of compensation circuits coupling a gate on one FET in the first series-coupled plurality of FETs to a body on another one of the first series-coupled plurality of FETs; a second FET stack coupled between the transmit node and the first reference node, the second FET stack including a second series-coupled plurality of FETs, each of the second series coupled plurality of FETs having a gate and a body; a second plurality of compensation circuits, each of the second plurality of compensation circuits coupling a gate on one FET in the second series-coupled plurality of FETs to a body on another one of the second series-coupled plurality of FETs; a third FET stack coupled between the transmit node and the antenna node, the third FET stack including a third series-coupled plurality of FETs, each of the third series-coupled plurality of FETs having a gate and a body; and a fourth FET stack coupled between the receive node and the second reference node, the fourth FET stack including a fourth series-coupled plurality of FETs, each of the fourth series coupled plurality of FETs having a gate and a body.

In another embodiment, a method of fabricating a radio frequency (RF) switch is provided, the method comprising: forming a first field effect transistor (FET) stack over an active surface of a semiconductor substrate, the first FET stack including a first series-coupled plurality of field effect transistors (FETs), wherein the first series-coupled plurality of FETs includes: a first FET, the first FET including a first gate and a first body; and a second FET, the second FET including a second gate and a second body; forming a first compensation circuit; and electrically coupling the first compensation circuit to the first body and the second gate.

The foregoing detailed description is merely illustrative in nature and is not intended to limit the embodiments of the subject matter or the application and uses of such embodiments. As used herein, the words "exemplary" and "example" mean "serving as an example, instance, or illustration." Any implementation described herein as exemplary or an example is not necessarily to be construed as preferred or advantageous over other implementations. Furthermore, there is no intention to be bound by any expressed or implied theory presented in the foregoing technical field, background, or detailed description.

For the sake of brevity, conventional semiconductor fabrication techniques may not be described in detail herein. In addition, certain terminology may also be used herein for the purpose of reference only, and thus are not intended to be limiting, and the terms "first", "second" and other such numerical terms referring to structures do not imply a sequence or order unless clearly indicated by the context.

The foregoing description refers to elements or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with) another element, and not necessarily mechanically. Thus, although the schematic shown in the figures depict one exemplary arrangement of elements, additional intervening elements, devices, features, or components may be present in an embodiment of the depicted subject matter.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A radio frequency (RF) switch comprising:
a first FET stack coupled between a first node and a second node, the first FET stack including a first series-coupled plurality of field effect transistors (FETs), wherein the first series-coupled plurality of FETs includes:
a first FET, the first FET including a first gate and a first body; and
a second FET, the second FET including a second gate and a second body; and
a first compensation circuit electrically coupling the first body and the second gate, wherein the first compensation circuit is directly connected between the first body and the second gate, and the first compensation circuit is not directly connected to the first gate.

2. The RF switch of claim 1, wherein the first compensation circuit is characterized by a first impedance configured to compensate for variations in leakage current across the first series-coupled plurality of FETs.

3. The RF switch of claim 1, wherein the first compensation circuit includes a first capacitor.

4. The RF switch of claim 1, wherein the first compensation circuit includes a first varactor.

5. The RF switch of claim 1, wherein the first compensation circuit includes a resistor-capacitor (RC) series circuit.

6. The RF switch of claim 1, wherein the first compensation circuit includes an active impedance-providing component.

7. The RF switch of claim 1, wherein the first series-coupled plurality of FETs further includes:
a third FET, the third FET including a third gate and a third body; and
a second compensation circuit electrically coupling the second body and the third gate.

8. The RF switch of claim 1, wherein the first series-coupled plurality of FETs further includes:
a third FET, the third FET including a third gate and a third body;
a fourth FET, the fourth FET including a fourth gate and a fourth body; and
a second compensation circuit electrically coupling the third body and the fourth gate.

9. The RF switch of claim 1, further comprising a second FET stack coupled between a third node and a fourth node, the second FET stack including a second series-coupled plurality of FETs, wherein the second series-coupled plurality of FETs includes:
a third FET, the third FET including a third gate and a third body;
a fourth FET, the fourth FET including a fourth gate and a fourth body; and
a second compensation circuit electrically coupling the third body and the fourth gate.

10. The RF switch of claim 1, wherein the first series-coupled plurality of FETs comprise FETs fabricated on a substrate selected from a silicon-on-insulator (SOI) substrate, a gallium arsenide based substrate, a bulk silicon substrate, a gallium nitride (GaN) based substrate, a GaN on silicon substrate, and a GaN on silicon carbide substrate.

11. The RF switch of claim 1, wherein the first compensation circuit comprises one or more impedance-providing components selected from a capacitor, a varactor, a resistor-capacitor (RC) series circuit, and an active impedance-providing component.

12. The RF switch of claim 6, wherein the active impedance-providing component is a metal oxide semiconductor field effect transistor.

13. The RF switch of claim 6, wherein the active impedance-providing component is a metal oxide semiconductor capacitor.

14. The RF switch of claim 1, wherein the first series-coupled plurality of FETs comprise FETs fabricated on a substrate selected from a gallium arsenide based substrate, a gallium nitride (GaN) based substrate, a GaN on silicon substrate, and a GaN on silicon carbide substrate.

15. A radio frequency (RF) switch comprising:
an antenna node;
a transmit node;
a receive node;
a first reference node;
a second reference node;
a first field effect transistor (FET) stack coupled between the antenna node and the receive node, the first FET stack including a first series-coupled plurality of FETs, each of the first series-coupled plurality of FETs having a gate and a body, the first FET stack including;
a first plurality of compensation circuits, each of the first plurality of compensation circuits coupling a gate on one FET in the first series-coupled plurality of FETs to a body on another one of the first series-coupled plurality of FETs;
a second FET stack coupled between the transmit node and the first reference node, the second FET stack including a second series-coupled plurality of FETs, each of the second series coupled plurality of FETs having a gate and a body;
a second plurality of compensation circuits, each of the second plurality of compensation circuits coupling a gate on one FET in the second series-coupled plurality of FETs to a body on another one of the second series-coupled plurality of FETs;
a third FET stack coupled between the transmit node and the antenna node, the third FET stack including a third series-coupled plurality of FETs, each of the third series-coupled plurality of FETs having a gate and a body; and
a fourth FET stack coupled between the receive node and the second reference node, the fourth FET stack including a fourth series-coupled plurality of FETs, each of the fourth series coupled plurality of FETs having a gate and a body.

16. The RF switch of claim 15, wherein the first compensation circuit comprises one or more impedance-providing components selected from a capacitor, a varactor, a resistor-capacitor (RC) series circuit, and an active impedance-providing component.

17. A radio frequency (RF) switch comprising:
an antenna node;
a radio frequency (RF) node, wherein the RF node is selected from a transmit node and a receive node; and
a first field effect transistor (FET) stack coupled between the antenna node and the first RF node, the first FET stack including a first series-coupled plurality of FETs, each of the first series-coupled plurality of FETs having a gate and a body, the first FET stack including a first compensation circuit that is directly connected between a gate on one FET in the first series-coupled plurality of FETs and a body on another one of the first series-coupled plurality of FETs.

18. The RF switch of claim 17, wherein the first compensation circuit comprises one or more impedance-providing components selected from a capacitor, a varactor, a resistor-capacitor (RC) series circuit, and an active impedance-providing component.

19. The RF switch of claim 17, wherein the active impedance-providing component is a metal oxide semiconductor field effect transistor.

20. The RF switch of claim 17, wherein the active impedance-providing component is a metal oxide semiconductor capacitor.

21. The RF switch of claim 17, wherein the RF node is the receive node, and the RF switch further comprises:
   a transmit node;
   a reference node;
   a second FET stack coupled between the transmit node and the reference node, the second FET stack including a second series-coupled plurality of FETs, each of the second series coupled plurality of FETs having a gate and a body; and
   a second compensation circuit that is directly connected between a gate on one FET in the second series-coupled plurality of FETs and a body on another one of the second series-coupled plurality of FETs.

\* \* \* \* \*